United States Patent [19]

Hill et al.

[11] Patent Number: 5,293,556
[45] Date of Patent: Mar. 8, 1994

[54] KNOWLEDGE BASED FIELD REPLACEABLE UNIT MANAGEMENT

[75] Inventors: Fletcher L. Hill, Golden; Douglas A. Holm, Broomfield; Nancy R. Jurestovsky, Golden; Gregory A. Pinkham, Berthoud, all of Colo.

[73] Assignee: Storage Technology Corporation, Louisville, Colo.

[21] Appl. No.: 737,159

[22] Filed: Jul. 29, 1991

[51] Int. Cl.$^5$ .................. H04M 3/08; H04M 3/22; G06F 11/00
[52] U.S. Cl. .................. 364/551.01; 379/2; 379/10; 371/20.1; 371/29.1
[58] Field of Search .................. 379/2, 10, 11, 29; 340/652, 653; 371/8.1, 15.1, 16.5, 18, 21.6, 29.1, 20.1; 364/551.01, 570, 419, 550

[56] References Cited

U.S. PATENT DOCUMENTS

| | | | |
|---|---|---|---|
| 3,864,533 | 2/1975 | Erlund | 379/2 |
| 4,881,230 | 11/1989 | Clark et al. | 371/20.1 |
| 4,888,771 | 12/1989 | Benignus et al. | 371/16.5 X |
| 4,901,004 | 2/1990 | King | 379/10 X |
| 4,937,825 | 6/1990 | Ballard et al. | 371/15.1 X |
| 4,972,453 | 11/1990 | Daniel III et al. | 379/10 |
| 5,127,012 | 6/1992 | Hiliger | 371/29.1 |

OTHER PUBLICATIONS

Robert Dietsch and Nils Pierre, "Stored Program Controlled PABX, ASB900", Ericsson Review No. 2 (1979) vol. 56, pp. 64–71.
Bo Ryabeck and Anders Sundblad, "Centralized Supervision and Fault Location by Computer", Tele 1(1973) (Engl. Ed. Sweden) vol. 25, pp. 23–33.

*Primary Examiner*—Jack B. Harvey
*Assistant Examiner*—Eric W. Stamber
*Attorney, Agent, or Firm*—Duft, Graziano & Forest

[57] ABSTRACT

This failure management system architecture guides, detects, validates and logs field replaceable unit (FRU) changes. This system includes a guided capability by which service personnel use the guided process to select candidates for FRU swaps or FRU replacement. FRU change and swap detection is described as a function of FRU memory scanning coupled with embedded database query activity. For swap activity virtual Composite Failure Events are created to manage post-swap failures. Validation logic determines whether the changed FRU is positioned correctly, is at the correct hardware, software and feature level, executes diagnostics correctly and performs flawlessly during monitored and extended functional operation.

34 Claims, 9 Drawing Sheets

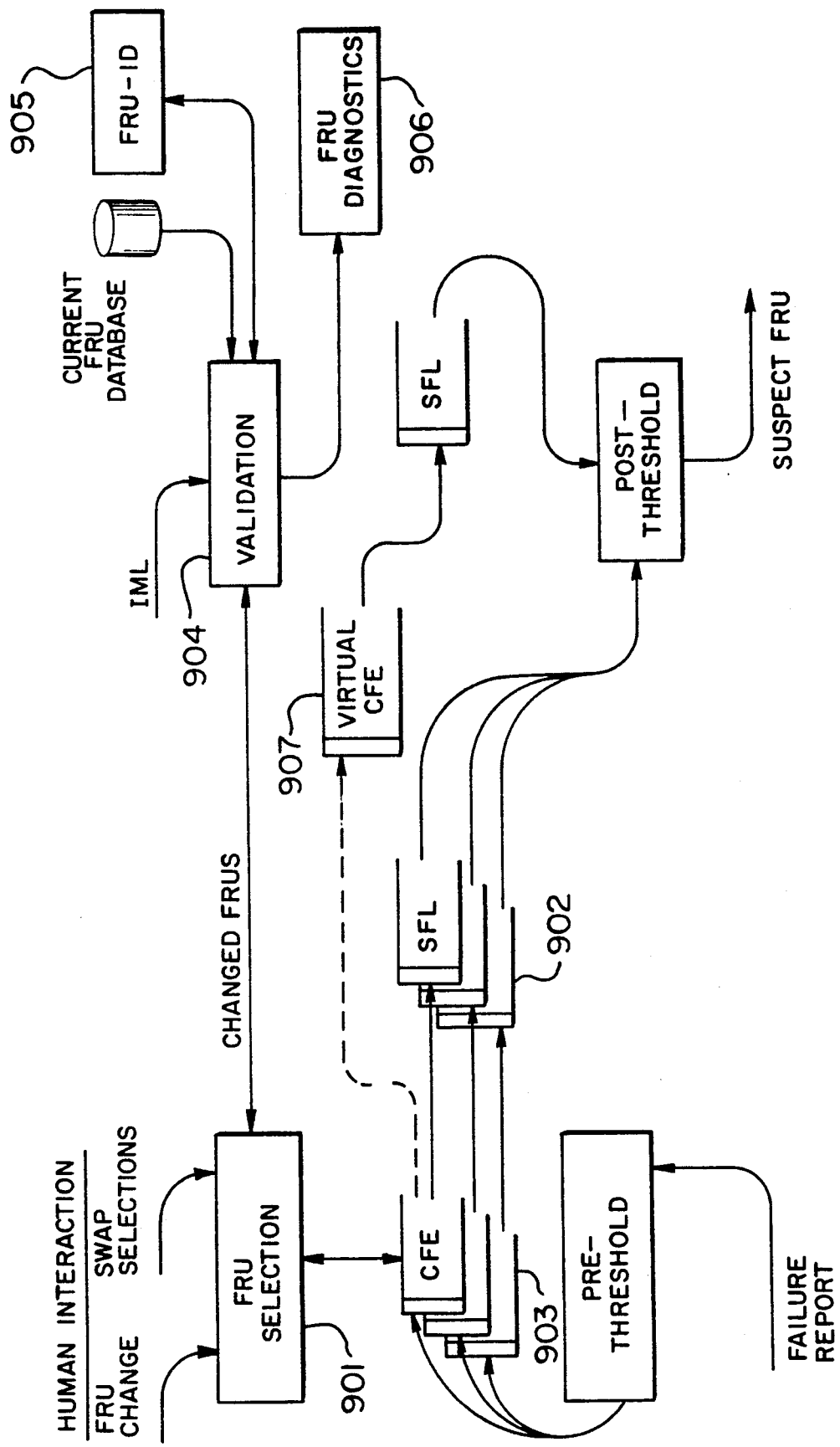
FIG. 9. GUIDED FRU REPLACEMENT BLOCK DIAGRAM

FIG. 10. SWAP MANAGEMENT
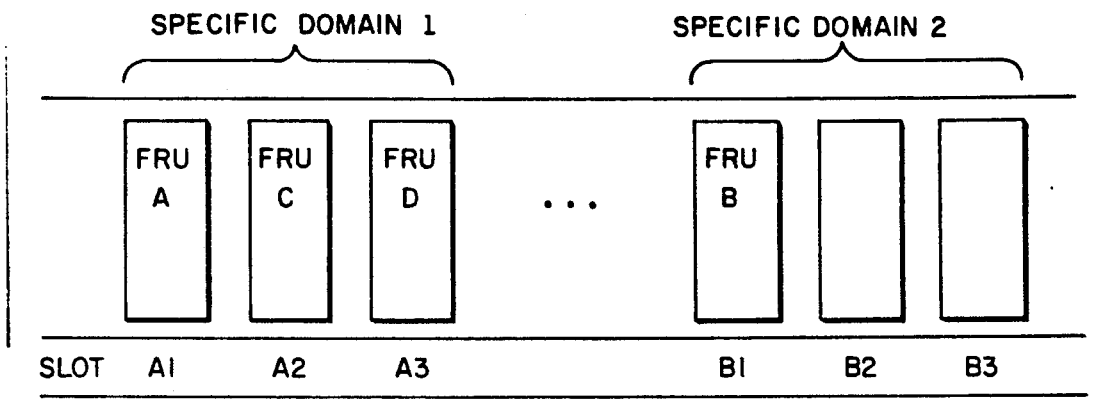
PRE-SWAP
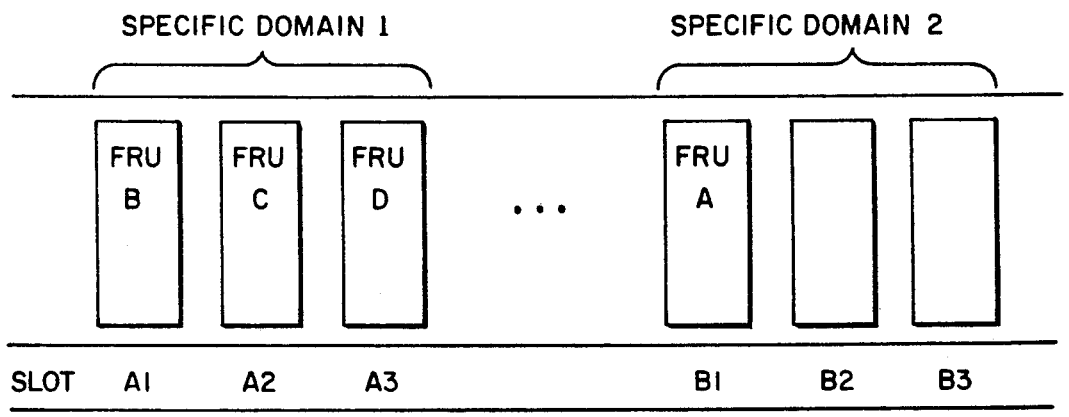
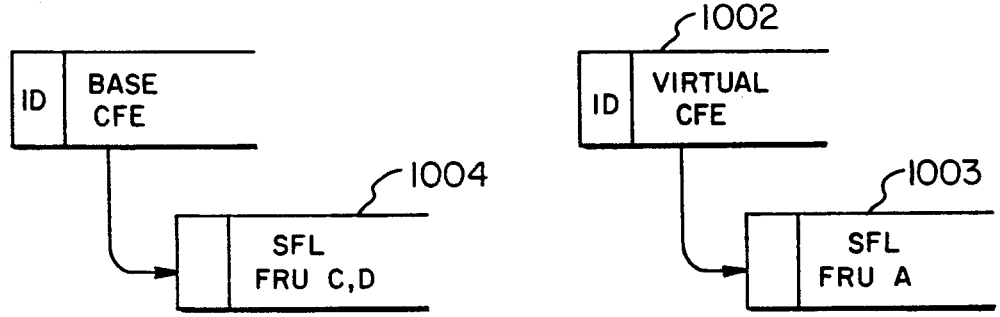
POST SWAP

KNOWLEDGE BASED FIELD REPLACEABLE UNIT MANAGEMENT

FIELD OF THE INVENTION

This invention relates to knowledge based systems and, in particular, to a knowledge based failure management system that is used to monitor failure activity, identify a failing field replaceable unit and guide corrective activity within customer equipment containing a multiplicity of field replaceable units.

PROBLEM

It is a problem in any system failure troubleshooting session involving FRU replacement, that accidental FRU misplacement, FRU incompatibilities, undesired system outages and FRU infant mortality contribute to situations in which the original problem symptoms and FRU configurations are confused or lost. It is often very difficult and expensive to resolve these situations.

This problem is compounded in customer systems where it is possible to perform FRU replacement concurrently with customer activity. Prior art systems require removal of customer activity and power from large portions of the customer system prior to L performing FRU replacement. This procedure often leads to massive losses of customer system availability for extended periods, particularly with customer systems in which a partial outage already exists in an unrelated portion of the customer system.

An additional hazard exists in customer systems which permit the removal and replacement of FRUs without first removing power. The benefits of such concurrent maintenance are frequently offset by the necessary suspension of customer activity on the entire customer system preceding such FRU replacement. Suspension is necessary in this case to prevent catastrophic loss caused by the sudden removal of the FRU while customer activity is present.

Additional potential for confusion exists during the isolation of long-term intermittents for which multiple FRUs are suspect when each isolation activity is manually logged and tracked. Significant loss results when accurate activity records are not maintained, in that FRU removal is often duplicated, maintenance time is extended and unnecessary customer system outages are caused.

All of these hazards are compounded when repair activity includes the exchange of like FRUs within the customer system, a common practice whose aim is to identify the source of a failure by moving the fault. Such activity frequently causes confusion with regard to original FRU placement and movement, particularly when several such actions are necessary to correctly identify the source of the fault. It is not uncommon for such activity to unintentionally introduce failures into the customer equipment which obscure or mask the original problem. Resolving such situations is extremely expensive in terms of time and personnel.

SOLUTION

The above described problems are solved and a technical advance achieved in the field by the knowledge based failure management system of the present invention which functions in a machine initiated maintenance environment to provide efficient and timely maintenance of customer equipment. The knowledge based failure management system provides the linkage between Guided FRU Replacement procedures, the Suspect FRU Lists contained in Composite Failure Events, the Fencing and Diagnostic subsystems, FRU Validation and all event logging. The Guided FRU Replacement procedures provide intelligent interaction with service personnel for problem selection and field replaceable unit (FRU) replacement.

The failure management system creates a Composite Failure Event for each problem that the customer equipment is tracking. Following internal isolation of an identified problem, the Composite Failure Event contains the Suspect FRU List, which is an ordered list of all FRUs which are potential causes of the identified problem. At the time of a service call, the Guided FRU Replacement process retrieves and displays all open problems in order of the severity indication contained within the Composite Failure Events associated with each open problem. When a Composite Failure Event is selected for service, the Guided FRU Replacement process displays the list of Suspect FRUs and their physical locations in the customer equipment in order from most likely failed FRU to least likely failed FRU. Upon selection of a FRU from this list by the craftsperson, the Guided FRU Replacement process points out the physical location of the FRU in the customer equipment, receives confirmation that the FRU replacement action was performed by the craftsperson, examines the new FRU information, tests the FRU as installed by the craftsperson, and places it in functional operation. Positive tracking, testing and logging of each FRU movement automatically within the customer equipment eliminates the risk of accidental misplacement of the FRU and infant mortality associated with such activity.

A significant additional attribute of this failure management system is the ability to establish fences (logical and physical constraints to access) around the FRU to be replaced so that customer activity may continue during the FRU replacement process with minimal impact to operation. This attribute permits FRU replacement concurrent with customer activity and eliminates the risk of such FRU replacement interfering with customer activity. It also permits technologies to be used which do not require the removal of power to a FRU during replacement. This combination of technologies contributes powerfully to fault-tolerant design and enhanced customer system availability.

Customer equipment availability is further increased when the Guided FRU Replacement process examines the impact of proposed fencing and FRU replacement activity prior to permitting either to occur. If availability limitations exist and the Guided FRU Replacement process determines that the FRU replacement activity would reduce customer system availability below an allowable minimum, Guided FRU Replacement suggests alternate actions to the craftsperson to mitigate existing equipment and service limitations prior to FRU replacement.

The Guided FRU Replacement architecture has a further advantage of assisting the craftsperson in problem isolation by proposing and guiding the exchange of like FRUs between unrelated domains within the customer equipment. Because the failure may reappear within a completely unrelated domain as a result of this FRU swapping activity, the Guided FRU Replacement process creates a special class of Composite Failure Event, linked to the original problem Composite Failure Event, to track each domain in which an exchange of FRUs has occurred. It is then able to log and track the movement of FRUs within the customer equipment and restore an original FRU configuration on request.

Another advantage of this failure management system architecture is the ability of the Guided FRU Replacement process to directly examine the FRU-specific information embedded within a memory on the FRU itself. This FRU information contains details on FRU features and compatibilities. Use of this information eliminates the risk of accidental installation of incompatible FRUs, and enables the identification of compatible FRU exchange candidates. This failure management system architecture provides the significant benefit of positively identifying the insertion and location of new FRUs at any time, enabling the failure management system to detect a FRU change during system bringup, assess the validity of the new FRU and determine whether the FRU should operate correctly in this particular customer equipment environment.

Additionally, this failure management system architecture eliminates the risk of FRU misplacement. When the craftsperson indicates a completed placement of a FRU, the Guided FRU Replacement process examines the intended FRU location in the customer equipment. If a FRU change has not occurred in that intended location, the Guided FRU Replacement process searches any subset of FRUs in the customer equipment to locate a FRU which has been replaced with a new FRU. The risk of misplacement is further reduced with the addition of a small indicator on each FRU which is illuminated by the Guided FRU Replacement process to show the craftsperson the FRU to remove. If a misplacement is detected, the Guided FRU Replacement process instructs the craftsperson to restore the FRU configuration which existed before the misplacement, eliminating any confusion and failures which may arise from the misplacement.

A significant additional attribute of this failure management system architecture is the provision for delayed closure of a problem following FRU replacement. The ability of the Guided FRU Replacement process to flag a FRU change as a hypothetical solution to the problem identified in the Composite Failure Event permits the knowledge based failure management system to react positively to a subsequent occurrence of the problem. In a similar manner, the completion of a probationary period in full functional operation by the replacement FRU permits the knowledge based failure management system to accept the FRU as the problem solution and close the problem.

BRIEF DESCRIPTION OF THE DRAWING

FIG. 9 illustrates the guided FRU replacement subsystem in block diagram form; and FIG. 10 illustrates the process of generating a virtual Composite Failure Event for a FRU swap activity.

DETAILED DESCRIPTION

Figure 1:
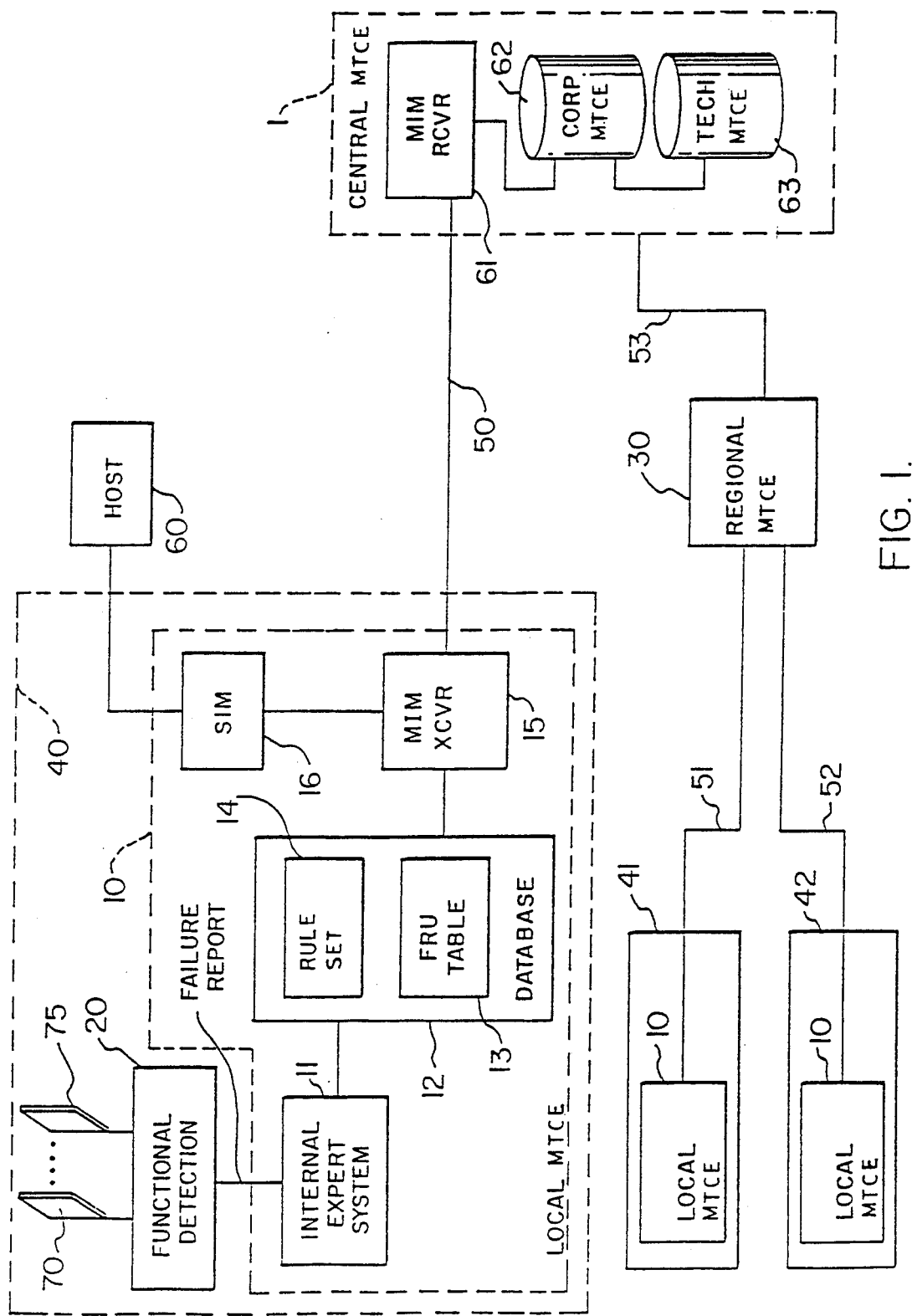
FIG. 1 the distributed hierarchical machine initiated maintenance system in block diagram form.

FIG. 1 illustrates in block diagram form the hierarchical distributed knowledge based machine initiated maintenance system. A plurality of customer equipment 40-42 are illustrated connected to a central maintenance system 1 via corresponding communication links 50-53. Included in each customer equipment 40 or adjunct thereto is a machine initiated maintenance system 10 which functions to communicate with central maintenance system 1 in order to provide instantaneous and efficient error identification reporting and collection. Each customer equipment 40 can be directly connected to the central maintenance system 1 or, alternatively, a plurality of customer equipment 41, 42 can be connected to a regional maintenance system 30 and a plurality of the regional maintenance systems 30 can be connected to the central maintenance system 1. The maintenance system is hierarchically arranged with local customer equipment 40-42 being serviced by its associated internal maintenance system 10 and a pool of customer equipments 41, 42 and their associated maintenance systems 10 being serviced by a corresponding regional maintenance system 30. A pool of regional maintenance systems 30 are then connected to the central maintenance system 1. The sophistication and complexity of each level of the maintenance system can be selected to correspond to economic factors, such as the installed worth of the equipment that is so maintained. Therefore, the local maintenance system 10 may be of lesser complexity than the regional maintenance system 30 since it must be replicated in each customer equipment 40. The regional maintenance system 30 can be of increased complexity since it serves a plurality of customer equipments 41-42 and views the data collected from all of these systems to thereby obtain a broader perspective on error conditions. Similarly, the central maintenance system 1 can be a sophisticated and expensive system since it serves all installed customer equipment 40-42 and supports all the regional maintenance systems 30. The central maintenance system 1 maintains records of all failures that have occurred in all customer equipment 40-42 and can therefore detect failure patterns using this data that are beyond the scope of the ability of the regional 30 or local maintenance systems 10 due to the limited pool of data available to these systems.

Customer Equipment Architecture

Customer equipment 40 is typically constructed of a plurality of field replaceable units (FRU) 70-75, each of which performs a designated, well defined function. Additional elements may be provided in customer equipment 40 that are not field replaceable units, in that a craftsperson can not simply repair or replace these elements. However, for the purpose of simplicity of description, all functional subelements contained within customer equipment 40 are designated as field replaceable units whether indeed they can be physically replaced by a craftsperson in the traditional field replaceable unit sense. The physical configuration of the customer equipment 40 is not particularly pertinent to the concept of this invention and the term field replaceable unit should not be construed as any limitation on the operational abilities of the subject system.

Within each customer equipment 40 is a number of functional detection circuits 20 that monitor the operational status of the field replaceable units (70-75) contained in customer equipment 40. The functional detection circuits 20 can be part of field replaceable units 70-75 or separate elements and consist of the error detection, diagnostic and maintenance apparatus that is well known in the art. This apparatus is not disclosed in any further detail for the purpose of simplicity. The hardware and software that comprise functional detection circuits 20 transmit a failure report to local maintenance system 10 whenever the functional detection circuits 20 determine that one or more of the hardware or software components contained within customer equipment 40 has failed.

In order to enhance the effectiveness of the failure report process, the report is formulated to reflect the customer equipment architecture which typically is a plurality of processes which operate over paths that connect nodes. Each path interconnects at least two nodes and may incorporate elements of data transmission, process control signals, or both. The nodes typically incorporate; functions which exist as subsets of physical field replacement units 70-75. It is possible for a node to be contained wholly within a field replaceable unit 70-75, or on a boundary of a field replaceable unit 70-75 interfacing with a path, or as a function which spans elements of more than one field replaceable unit 70-75.

Figure 5:
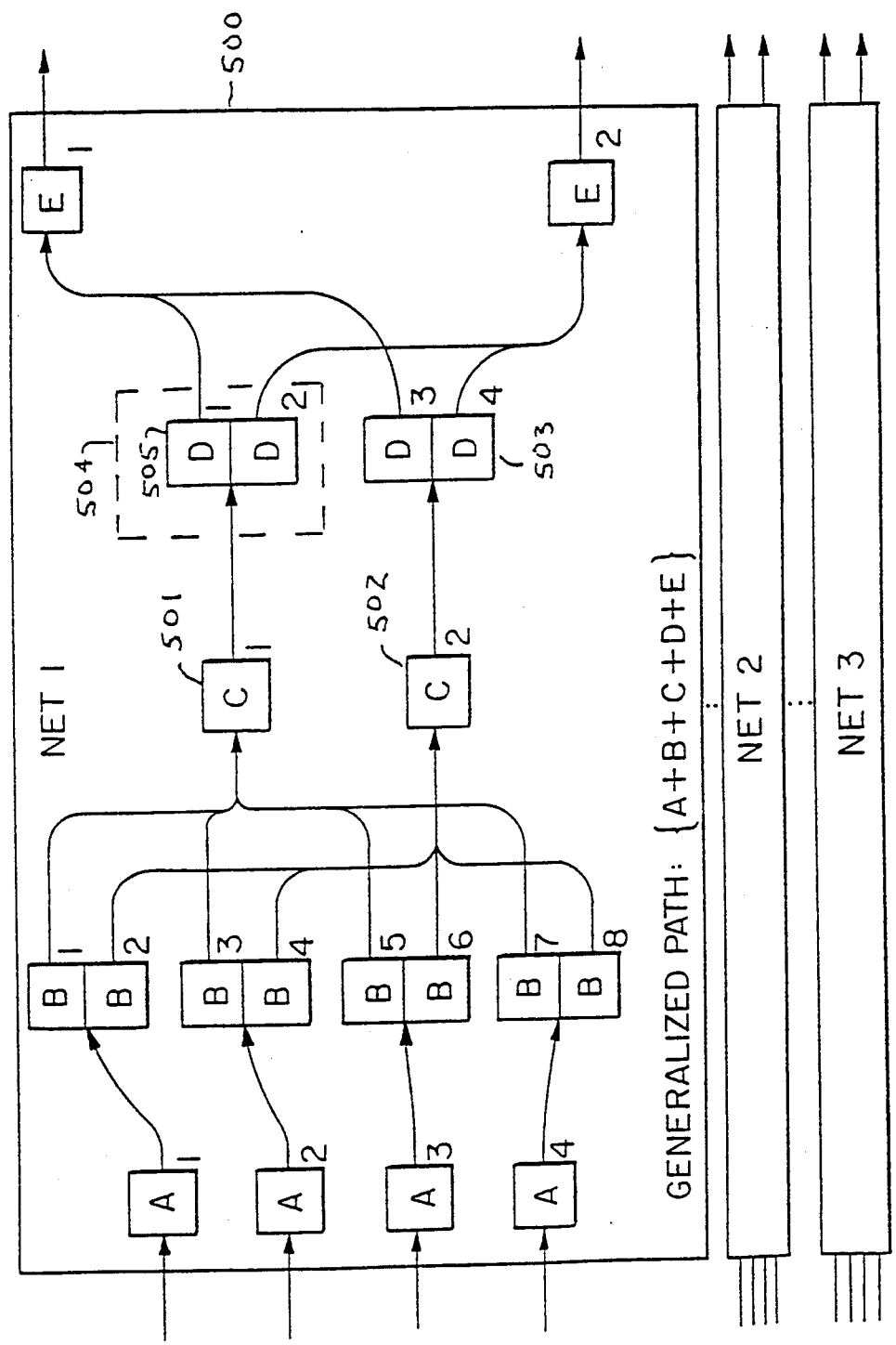
FIG. 5 illustrates the topology of the customer equipment.

In a manner analogous to the "normalization" of relational data, a composite generalized path may be described as containing all nodes necessary to describe a complete path. FIG. 5 illustrates this concept. A signal travelling from left to right through the circuit in NET 1 passes over a generalized path through the node network consisting of one node A, one node B, one node C, one node D and one node E. A generalized domain, then, is a map which shows a subset of the generalized path. Nodes B, C and D, for example, illustrate a generalized domain subset of the generalized path A, B, C, D, E.

A process, however, uses a very specific path under very specific rules. For instance, if node Cl is a controlling processor which is to obtain a complete generalized path through the equipment, it must arbitrate for or otherwise obtain a node A, then a node B which is physically linked to a node A by a path, then a path to itself, and so on. One specific domain acquired by node C1, might be Node A1, Node B1, Node C1, Node D2, Node E2.

If an operation does not require an entire generalized path, the generalized domain describes the subset of the generalized path that is used. A generalized domain consisting of Nodes A, B, C and D, then, has a specific domain which describes exactly which node A, B, C and D are in use. One such specific domain might be Node A1, Node B1, Node C1 and Node D1.

The specific domain is used to describe any set of resources in use during an operation. If Node C1 detects an error during the operation described above, valuable information is obtained when Node C1 identifies the specific domain consisting of all resources which were in use at the time of the failure, in addition to indicating any symptoms of the failure.

Local Maintenance System Architecture

Local maintenance system 10 includes an internal expert system 11 and an associated database 12 that contains a table of all errors detected by functional detection circuits 20. Also included in maintenance system database 12 is a field replaceable unit table 13. This element defines the field replaceable units 70-75 contained within customer equipment 40 and their interconnection such that this data and the operational diagnostic rules can be used by expert system 11 to diagnose and isolate the system failures to a single failed field replaceable unit 70-75 in customer equipment 40. Machine initiated maintenance transceiver 15 functions to establish and maintain a data communication connection with the central maintenance system 1 via the associated communication lines 50. Machine initiated maintenance transceiver 15 also provides a link with any other local error reporting systems such as Service Information Message (SIM) system 16 connected to host computer 60.

In operation, the functional detection circuits 20 identify failures that occur within customer equipment 40. The amount of data provided by functional detection circuits 20 is a function of the complexity of this apparatus. Local maintenance system 10 receives the failure report from functional detection circuits 20, and stores this data in database 12 to create a history log of all failures in customer equipment 40. Expert system 11 analyses the failure report received from functional detection circuits 20 using the rules and hypotheses programmed into rule set 14 for use by internal expert 11. Internal expert system 11 can retrieve additional data from sensor and data collection points within customer equipment 40 or can activate failure evaluation capabilities contained within customer equipment 40 in order to collect additional data concerning the operational status of customer equipment 40 as well as perform dynamic reconfiguration (fencing) in order to prove or disprove a hypothesis, or remove a field replaceable unit from operation. The rule set 14 used by internal expert system 11 as well as the field replaceable unit dictionary 13 enable the internal expert system 11 to isolate the source of the detected error to a single or at least a small number of field replaceable units 70-75 contained within customer equipment 40. Additionally, internal expert system 11 assigns a severity level to the detected failure as an indication of the appropriate level of maintenance response for this detected error.

The processing of errors is a function of the severity level assigned to the detected errors. Errors can be simply recorded and the identified failed field replaceable unit monitored or a low level alert generated to indicate to maintenance personnel that a noncritical unit within customer equipment 40 has failed. A communication connection can be established via machine initiated maintenance transceiver 15 to the regional 30 or central maintenance facility 1 to request the immediate dispatch of repair personnel when a critical error has been detected that significantly effects the functioning of customer equipment 40.

A second function performed by internal expert system 11 is the isolation function where the failed field replaceable unit 70 is disabled, or reconfigured, or isolated within customer equipment 40. The exact manner in which this is accomplished is a function of the architecture of customer equipment 40 and the nature of the field replaceable unit 70 that failed. The isolation function can be as simple as preventing the failed field replaceable unit 70 from being accessed by the control elements of customer equipment 40.

Internal Expert System Architecture

Figure 2:
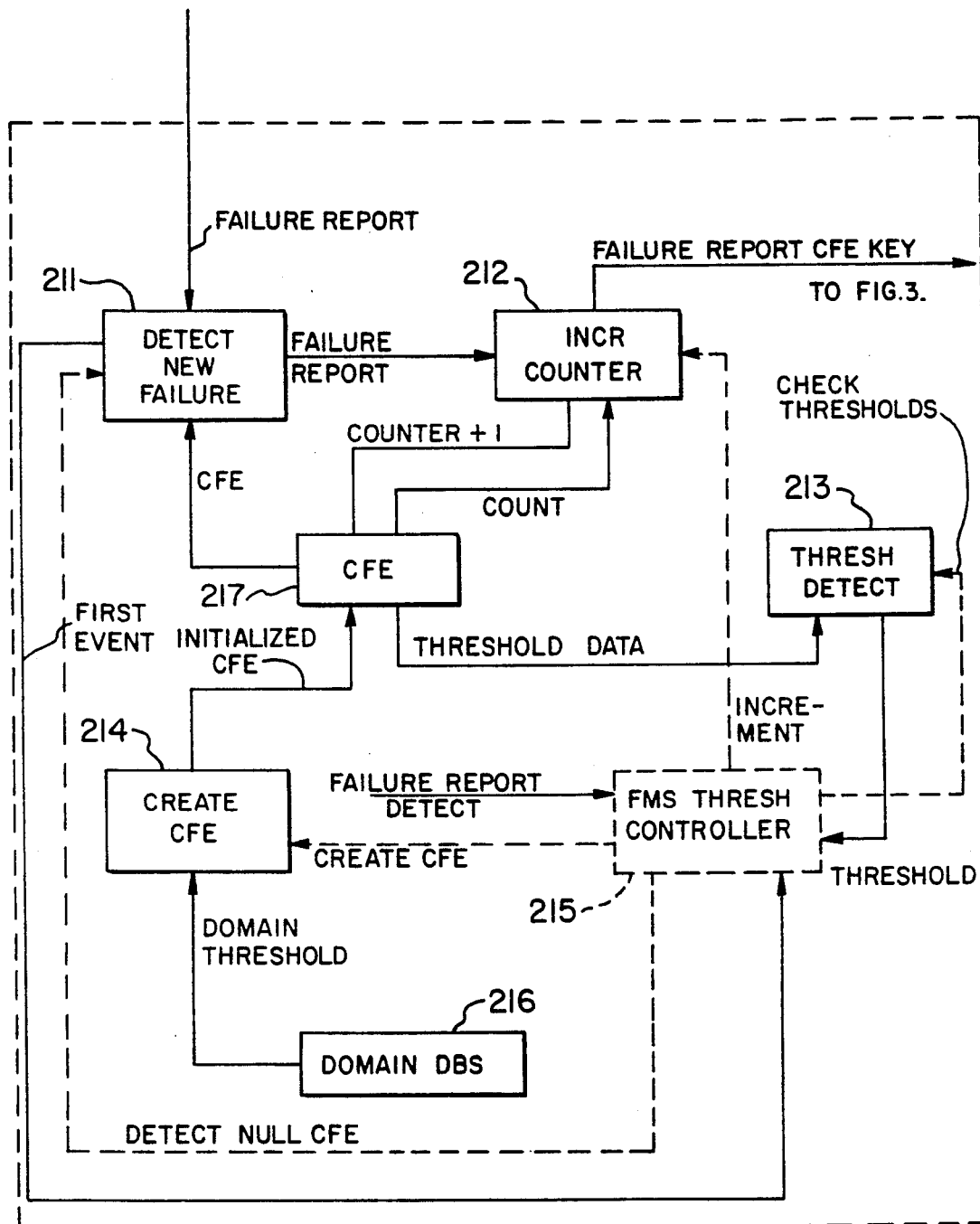
FIGS. 2 and 3 illustrate this apparatus in further detail.
Figure 3:
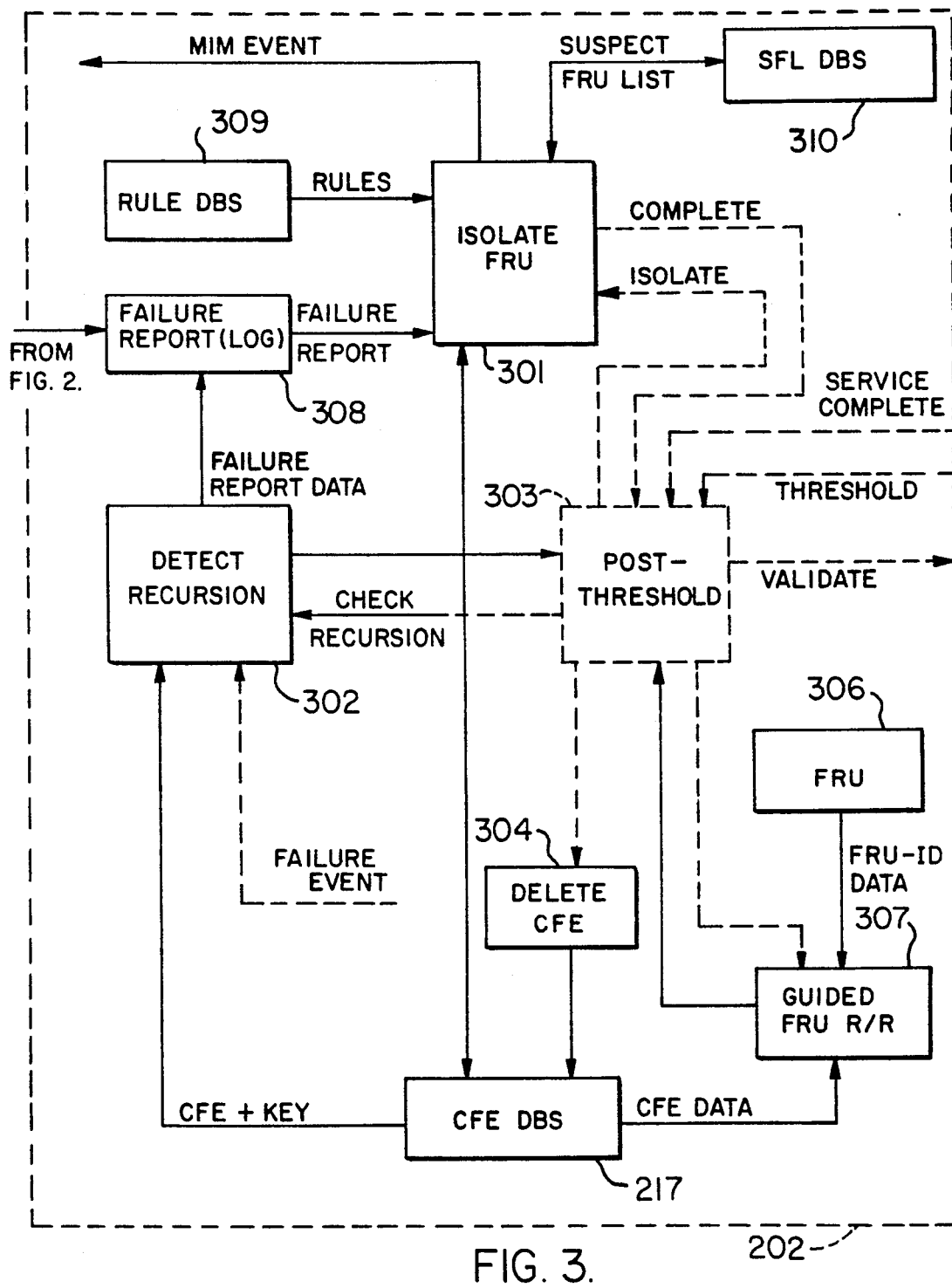

FIGS. 2 and 3 illustrate on a block diagram level the architecture of internal expert system 11. Internal expert system 11 is a special purpose expert system engine, operating in real time, which is tied to a relational/object database 12. Internal expert system 11 includes a facts database which represents the accumulated failure reports, a set of hypotheses (the suspect field replaceable unit list) and an inference engine which includes the rule and procedure execution process. This expert system can learn via recursion and rules modification. This rules database can also be modified from a remote location by either the regional expert system 30 or the central expert system 1. The architecture of the internal expert system 11 illustrated in FIGS. 2 and 3 consists of two major subportions. Prethreshold processing 201 represents the processes that are operational in internal expert system 11 prior to a fault in the associated customer equipment 40 reaching a level of criticality or a sufficient number of instances to require activation of post threshold processing 202 which represents the isolation, maintenance and recovery portion of internal expert system 11.

In this description the term failure domain is used and this term denotes the boundaries within which a given failure operates. The failure domain includes a number of aspects: physical, temporal, severity, persistence, threshold, etc. A number of repetitions of a failure may be required before the failure domain can be established with any precision. This threshold can be varied for each different failure symptom or class. It is obtained and modified empirically and shows up in the system as a new or revised object. The failure management process accrues failure information until a clear picture of the failure domain emerges. At that point a transition occurs to permit the embedded expert system process to perform isolation based on information relating to the failure domain. A composite failure event (CFE) is associated with each emerging failure domain and identifies the states that the failure domain has passed through and summarizes what is currently known about the failure domain. The prethreshold processing block 201 performs the composite failure event creation and the data accumulation.

Failure Report Structure

A multi-path architecture such as that illustrated in FIG. 5 permits a detecting processor to coordinate failure recovery within the same domain, within a partially overlapping domain, or on a totally different domain. The object of failure recovery is to complete the customer process. While doing so it is possible to gain considerable insight into a detected failure.

The failure report provides concise summary failure data from the original occurrence as well as information indicative of each recovery step taken during an attempt for customer equipment 40 to recover from the failure. Included in the failure report is a definition of the failing path and each path attempted or the successful path that was used to overcome the failure. In addition, fault symptom codes are provided for the initial event and subsequent recovery actions. Corresponding information is provided about the operation that was in progress in customer equipment 40 at the time that the failure occurred.

Within the failure domain noted above, the following components are included:

| | |
|---|---|
| 1. Physical Locale: | An operation attempting to use a component bounded by the locale will result in the failure. |
| 2. Persistence: | Measure of the repeatability of the failure. Low persistence indicates transience. |
| 3. Functional/Operational Boundary | A set of functions and/or operations which result in this failure. |
| 4. Severity: | The level of degradation of system performance which results from this failure. |
| 5. Detectability: | The symptoms by which the failure is identified. |

Figure 6:
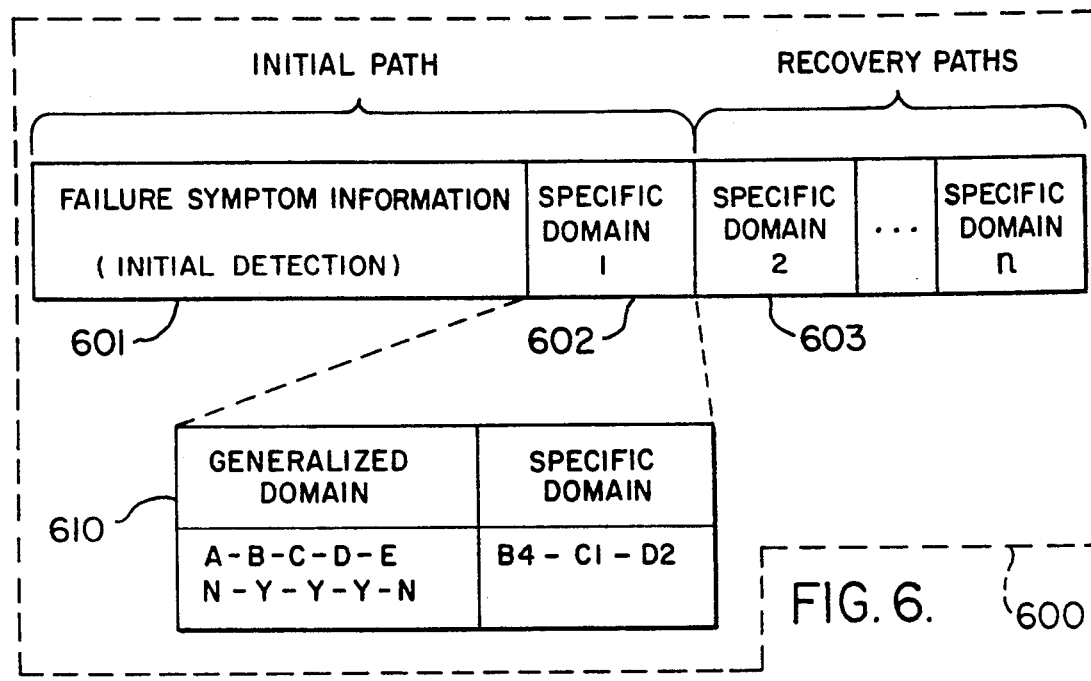
FIG. 6 illustrates a typical format of a failure report.

The detecting processor initializes a failure report 600, in which it places initial symptom data 601 and describes the specific domain 602 in operation at the time of the failure, as illustrated in FIG. 6. It then attempts to recover the operation on the same specific domain. Each recovery action increments a count corresponding to that specific domain. This activity establishes the persistence of a failure within the specific domain. If the processor completes the customer operation successfully on the original specific domain, the failure activity is complete and the failure report 600 is sent to the failure management system. If it did not successfully recover within a retry threshold, it allocates a path which is different in some respect such as including different elements to implement the path from the original failing path and attempts recovery there. The new specific domain 603 is appended to the original failure report 601, 602. A count of the number of attempts is maintained within each specific domain field. The processor continues to vary the specific domain in use until either the operation is successful or the processor determines that recovery options are exhausted and the system cannot recover from the failure. Each specific domain variant is appended to the failure report 600 along with a count of the number of attempts on that specific domain. When either the operation succeeds or the processors give up, the failure activity is complete, and the failure report 600 is sent to the failure management system. It is possible, but not necessary, to indicate observed failure symptom variants with the domain in which they were observed. In this way, the failure report 600 is able to condense many discrete failure detections into a single informative record.

In operation, the functional detection circuits 20 detect a failure within one of field replaceable units 70–75 and produce a failure report 600 indicative of the failure that has been detected. The failure report 600 is input to the detect new failure report process 211 which compares the domain 602 and symptom 601 information of the received failure report 600 with those previously received and those for which a composite failure event has been created.

Composite Failure Event

Figure 7:
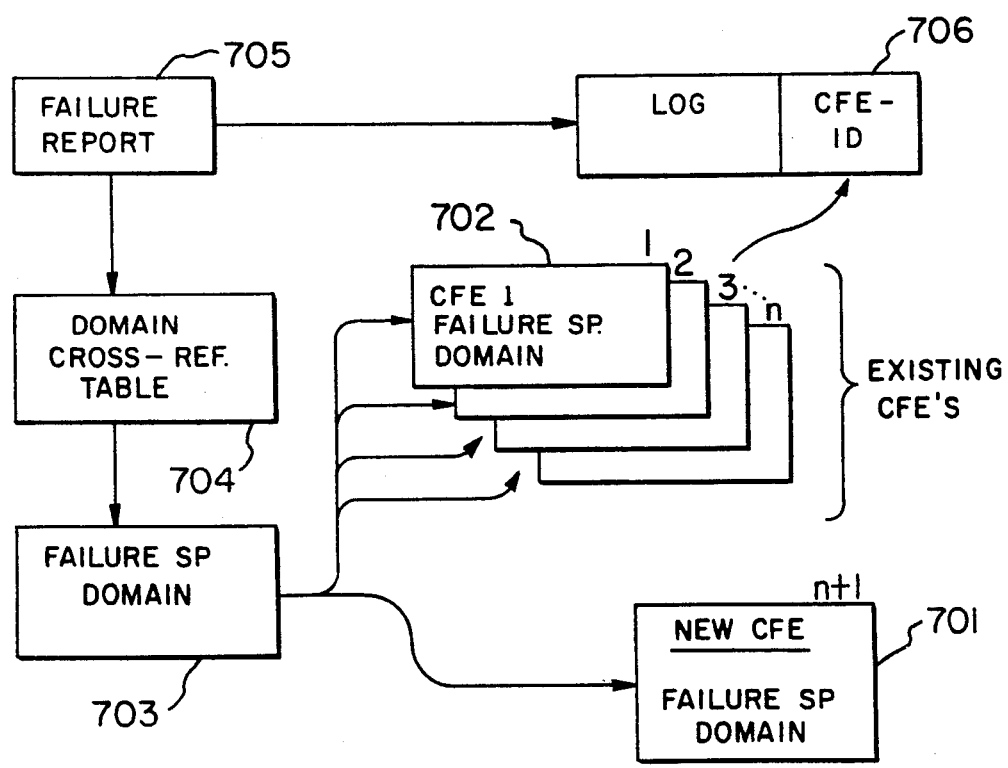
FIG. 7 illustrates the process of generating composite and failure events and failure report matching.

A composite failure event 701 is formed from a failure report 705 when that failure report 705 describes a failure occurring in a specific domain which has not been observed before. The composite failure event 701 accumulates failure information to form a composite image of events which are occurring within a failure domain, and tracks the failure domain throughout its life cycle. Each composite failure event 701 is given a unique identity which is used to associate all events which may be logged, as illustrated in FIG. 7.

When a failure report 705 is received by the failure management system, the initial failure symptom 601 is converted to a generalized domain from domain database system 216 which indicates the paths and nodes on which that failure is typically observed. These observations are the result of collecting and analyzing empirical results within a central expert system environment. Additionally, the failure symptom is associated with a severity threshold, a persistence threshold and a characteristic impact to normal operation, also empirically obtained. It is important to note that the generalized domain 610 for the failure may be different in some particulars from the generalized domain observed during operation. Some correlation will always exist. The threshold 804 and domain 802, 803 information from the initial detection are retained in the composite failure event 701.

The failure's generalized domain 610 is converted to a "failure specific domain" 802, 703 by using information embedded in the first operational specific domain 601 in the failure report. The failure specific domain 703 is then matched 704 against all failure specific domains 802 located within existing composite failure events 702. If no match is found, a failure has occurred which does not fit into the profiles of other failures which are currently being tracked. A new composite failure event 701 is created to track the new failure specific domain.

Isolation Expert System

Figure 8:
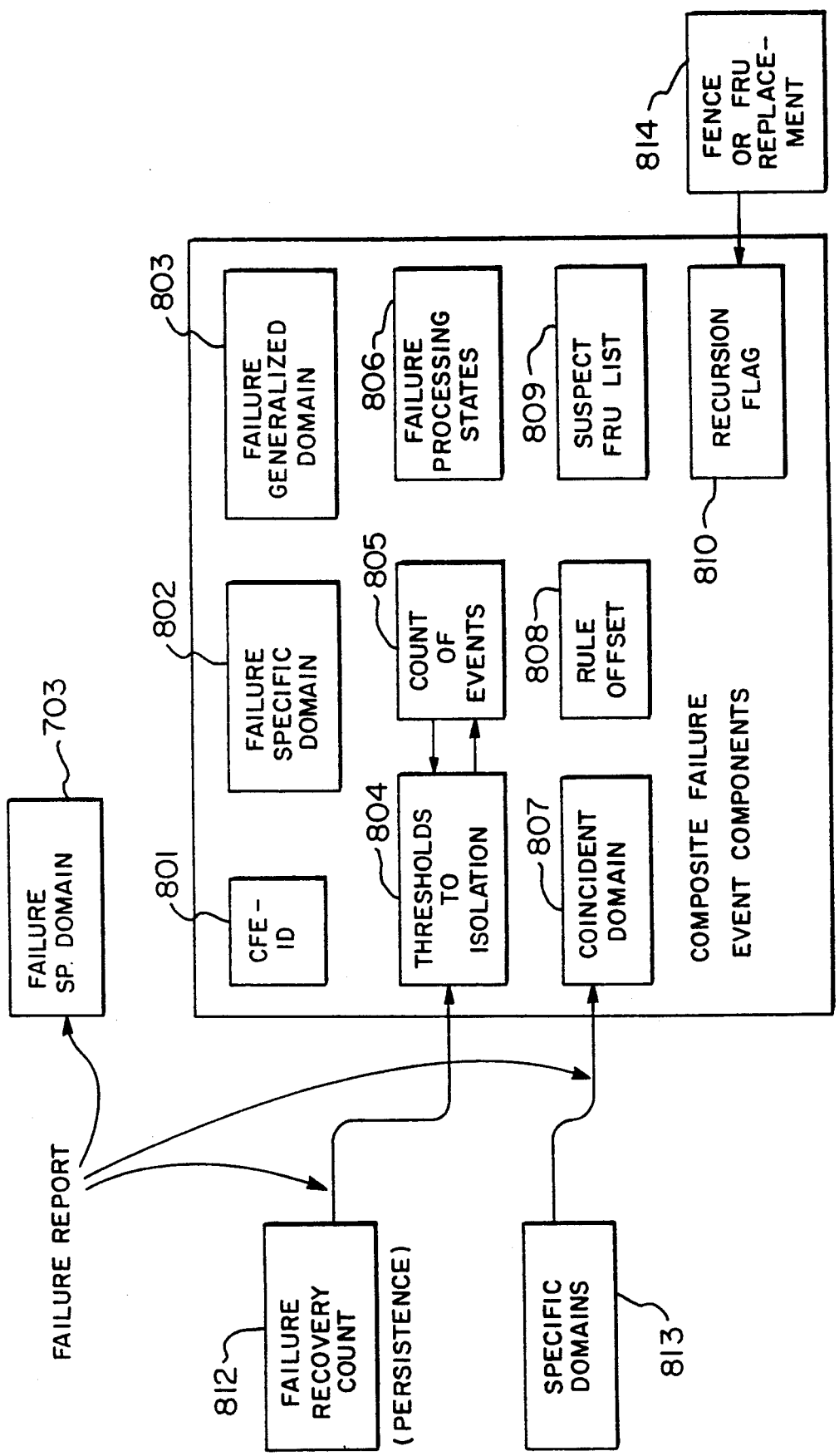
FIG. 8 illustrates the details of a typical composite failure event.

FIG. 8 illustrates the insertion of a failure report into a composite failure event 701. Once the failure specific domain has been matched to a composite failure event specific domain, the persistence count is compared to the persistence threshold 804. If exceeded, the composite failure event 701 is sent to the isolation expert system 301 for isolation. If the persistence threshold is not exceeded, the count of events 805 is incremented to indicate the receipt of a failure report. This count is compared to the severity threshold which is part of thresholds to isolation 804. If exceeded, the composite failure event 701 is sent to the isolation expert system 301 for isolation.

Once the composite failure event 701 has been sent to the isolation expert system 301 for isolation, it is flagged so that the arrival of a subsequent failure event does not cause additional isolation.

Pre Threshold Processing

If a composite failure event has previously been created 702, the detect new failure process 211 transmits data to increment counter 212 to increment the count of failures for this designated composite failure event. The increment counter process 212 retrieves the presently stored accumulated count 805 from CFE database 217 and increments this count by one and updates this information in the CFE database 217. This updated data is then compared by threshold detector process 213 which determines whether the accumulated count of events 805 for this composite failure event has exceeded the accumulation threshold which is a part of thresholds to isolation 804 that was assigned to this failure domain when the composite failure event was first created and the failure domain was inserted into the composite failure event. If the threshold is not exceeded, processing terminates. If however the threshold assigned to this particular composite failure event is exceeded, threshold detect process 213 activates threshold controller 215. Threshold controller 215 passes control to post threshold processing 303.

If the received failure report 705 can not be associated with an existing failure 702, process 211 creates a new composite failure event 701. It is accomplished by process 211 activating threshold controller 215 which creates a new composite failure event. This is accomplished by activating process 214 which is the create composite failure event process which retrieves data from the failure domain database 216 in order to create a new composite failure event. The domain data received with the failure report 705 is used to access the domain table in the domain database which supplies threshold and severity data for the composite failure event.

Post Threshold Processing

FIG. 3 illustrates the post threshold process 202 and its interaction with various databases and with the isolate field replaceable unit process 301. The post threshold processing element 303 operates in conjunction with the isolate field replaceable unit element 301 to perform the isolation processing step, including updating the suspect field replacement unit list contained in database 310 and the rule database 309. If the failure presently analyzed is a recursion event, then the detect recursion element 302 determines that this failure is a replication of priorly detected failures and adjusts the suspect FRU list 310 for the composite failure event to eliminate the FRU from consideration whose fencing or replacement caused the recursion flag to be set. This apparatus also executes the rules contained within rule database system 309 to remove as many suspect field replaceable units as possible from the suspect field replaceable unit list contained in the suspect field replaceable unit list database 310. The rules may invoke diagnostics, examine data, around potential failed units, reconfigure and other activities, in order to eliminate field replaceable units from the suspect field replaceable unit list. The goal of the process is to focus on a single likely field replaceable unit that is causing the detected failure. A guided field replaceable unit process 307 is included to interface with a craftsperson to manually replace a failed field replaceable unit and test the replacement field replaceable unit installed by the craftsperson in place of the failed unit. The isolation process executed in element 301 terminates either when there are rules left but no more field replaceable units in the suspect field replaceable unit list or when the rule action is complete.

Isolation Process

Figure 4:
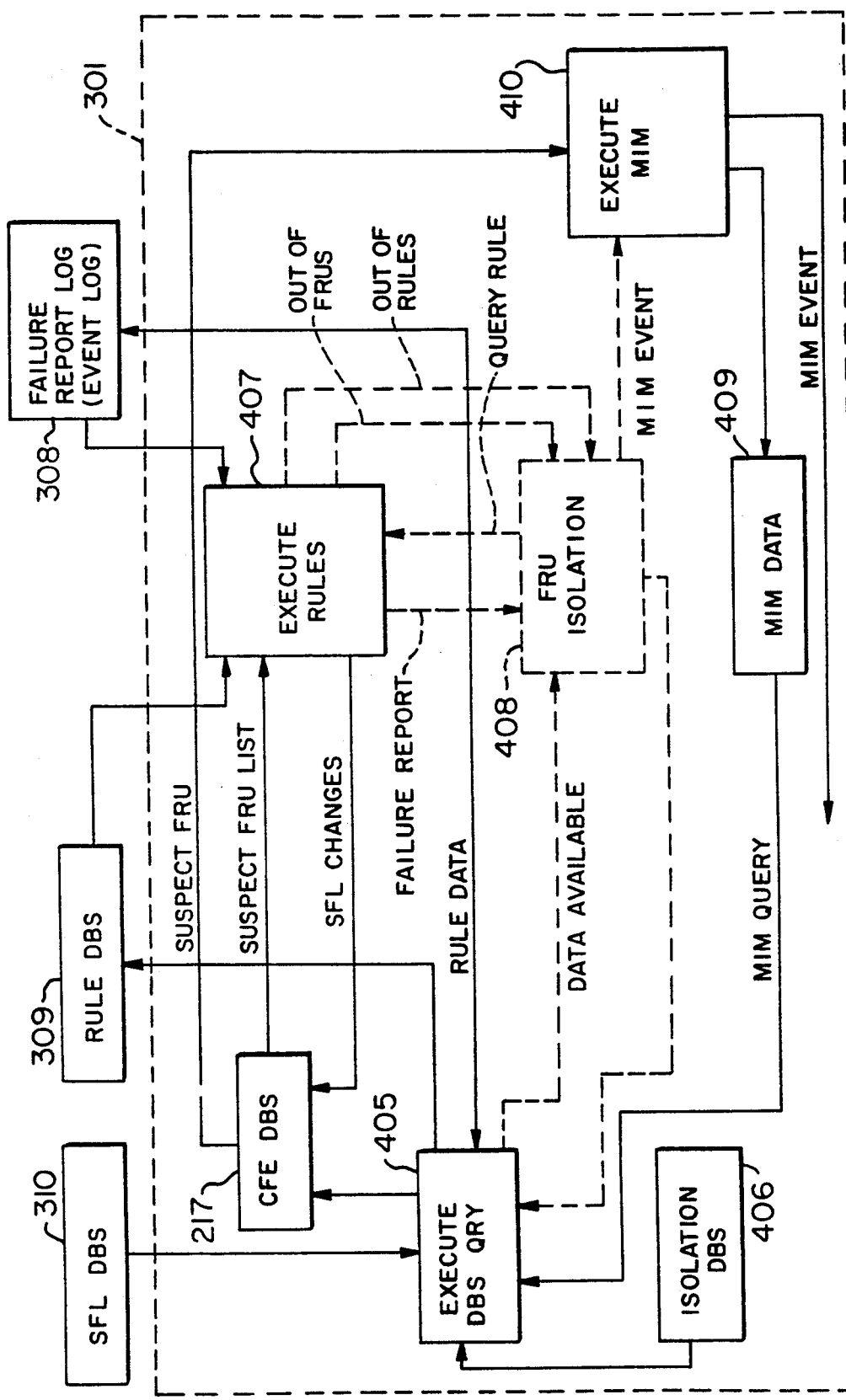
FIG. 4 illustrates additional details of the isolate field replaceable unit function.

FIG. 4 illustrates further details of the isolate field replaceable unit process 301. This process sets up the suspect field replaceable unit list using the domain identification from the composite failure event as a key and translates from the generic domain to the specific domain. The suspect field replaceable unit list is reduced by three mechanisms. First, if the composite failure event recursion trigger is set, then a member of the suspect field replaceable unit list that triggers the recursion is removed. Second, the suspect field replaceable unit list is modified by path coincidence, overlaying all paths from a number of failure reports related to this composite failure event identification. Finally, the rule set pertaining to the domain is invoked and allowed to run to completion. Rules continue to execute in process 407 even after exhaustion of the suspect field replaceable unit list since some rules are command oriented and require execution regardless of the suspect field replaceable unit list. After the rule execution is complete in process 407, the results are used to update the suspect field replaceable unit database 310, the composite failure event database 217, the failure report log 308 and the isolation database system 406.

The failure specific domain 802 contained within the composite failure event (FIG. 8) indicates all nodes which can be suspected as a cause of the failure mode represented by the composite failure event. The specific nodes can be placed within the physical field replaceable unit architecture, a process which yields a suspect FRU list 809 (SFL).

The isolation process seeks to eliminate as many suspect FRUs as possible from the suspect FRU list and rank the remaining members in order of likelihood that they caused the problem. The coincident domain 807 (FIG. 8) within the composite failure event figures strongly in this analysis, predisposing the results toward those nodes which were involved in the majority (if not all) of failure events. This may be implemented as a logical AND across all operational specific domains, or as a more sophisticated counting system in which each element of the domain is counted for each appearance.

If at any time a member of a SFL is replaced, a recursion flag 810 is set within the composite failure event (FIG. 8). If a subsequent failure occurs that falls within the failure specific domain (and hence the composite failure event), it is immediately apparent that replacement of the field replaceable unit did not resolve the failing condition. The recursion flag forces a new round of isolation to occur on the composite failure event (as described above) after first eliminating the replaced member of the SFL from consideration. The result is a new SFL with a new ranking.

When a member of the SFL is replaced the composite failure event is placed in an interim closure state, in addition to setting the recursion flag. This state is maintained for a predetermined failure has been resolved. At the expiration of the interim closure interval the composite failure event is placed in a closure state, at which time it is logged and eliminated from active comparison with new failure reports.

Global Fence Map

A global fence map exists which identifies each resource node and path in the customer equipment. For instance, in FIG. 5 a global fence map consists of the node-path map for each net such that all nodes A, B, C, D and E within net 1 (500) are identified along with all connections A1+B1, A1+B2; B1+C1, C1+D1; and so on until all possible path connections are identified; the same is done for nets 2 and 3. Then, for each node, the fence states of that node are indicated.

Multiple fence modes may be identified for any node. Although this disclosure refers to only a few fence modes, any number of fence modes may be implemented simply by adding additional modes. Techniques exist for simultaneously identifying all possible fence states which are applied to any node. That is, a node may be simultaneously fenced because a failure exists which affects that node and because that node falls within a region which falls within a diagnostic environment. All node fences for a given fence mode may be released without disturbing underlying fences which govern other fence modes.

Fencing the SFL Node-Path Domain

Given a general domain for net 1 (500) of A+B+C+D+E, it is immediately apparent that resource D4 is fenced if node C2 is made unable to access D4. The same effect may be achieved if C2 is unable to arbitrate with C1 for node E2. Consequently, if a failure is isolated to a SFL which consists of node D4, the customer equipment may continue in functional operation with minimal degradation if C2 is unable to arbitrate for resource E2. Any mechanism which prevents node C2 from arbitrating for resource E2 is sufficient in order to place the fence. Fencing node D4 by this means is more efficient than fencing it directly because the same fence mechanism may be used to remove E2 from use entirely, by arranging that neither C1 nor C2 is able to use E2. This has the effect of simultaneously fencing D2 and D4 from operation, and the paths D2+E2 and D4+E2. Thus the same fencing technique may be used for three discrete fencing actions.

Each node within the specific domain is examined in turn and the rule sequence executed for that node. Each rule in the rule sequence performs one fencing action.

Human Input

Human input to the expert systems is allowed at any level, since it will be propagated to all levels through system interaction. It occurs in response to Machine Initiated Maintenance events 410.

The MIM event may reveal one or more Suspect FRUs, or no Suspect FRUs at all. The former case requires FRU change interaction; the latter case is known as an Engineering Alert MIM because it typically involves central expert system and engineering resources to assist in problem resolution.

The unique identity of the composite failure event is also contained in the MIM event, and provides a problem reference which is used by the craftsperson when replacing FRUs to resolve the MIM.

Where one or more Suspect FRUs are indicated in the MIM, the craftsperson invokes an interactive dialogue called Guided FRU Replacement 307, or GFR. The craftsperson uses GFR 307 to select the composite failure event identity for which the MIM was sent, and selects the FRU to be replaced from the SFL that is continued in the composite failure event. GFR 307 in turn initiates fencing at the required level so that the FRU can be replaced without removing subsystem power, and encourages the craftsperson to proceed with the replacement. GFR confirms the replacement and invokes a series of validation diagnostics which test the FRU in isolation. On successful completion, GFR places the FRU in a closely-monitored functional operation with the craftsperson present. Following this, GFR sets the recursion flag (810) in the composite failure event, and alters the state (806) of the composite failure event to reflect an initial closure of the event.

All diagnostic and FRU change information is captured in the failure report log 308, which also contains the underlying failure reports. As with the failure reports, diagnostic and FRU change information are keyed with the composite failure event's unique identity. This permits internal or external reconstruction of the problem.

Fencing for FRU Replacement

If in net 1 the resources of D1 and D2 exist on a single FRU 504, and that FRU is to be removed from the customer equipment without halting concurrent customer operation through net 1, it is necessary to configure node C1 so that no node B (B1, B3, B5, B7) may access or interrupt node C1 if such an access or interrupt would require further access to a resource D or resource E. This manner of fencing has the effect of removing node C1 from customer operation.

In addition, it is necessary to condition paths D1+E1 and D2+E2 such that physical removal of the FRU 504 does not cause spurious noise on those paths which would prevent continued customer operation of paths D3+E1 and D4+E2. This may be accomplished by any of several methods of electrical and/or logical isolation which are common in the art. Subsequent to the fencing described, the FRU 504 may be removed while continued customer operation is present on net 1 using node C2.

Guided FRU Replacement (GFR)

The craftsperson who performs service on the customer equipment obtains the identity of the problem by any of a number of means, such as the Composite Failure Event ID 801. The craftsperson obtains one or more of the FRUs which are indicated in Suspect FRU List 809, which is the product of the isolation system, and is then ready to begin Guided FRU Replacement.

Guided FRU Replacement is an interactive procedure in which the failure management system initiates and controls a FRU-oriented dialogue with the craftsperson. While this dialogue is in effect, the failure management system suspends external communication of failure events and associated isolation activities which are related to the active FRU change or exchange activity by Composite Failure Event ID. In this way, failures which are introduced during the course of system maintenance do not overload the external communications link. This suspension of reporting related failure events does not prevent the ordinary communication of failure events and associated isolation activities which are not related to the present FRU change or exchange activity.

Guiding FRU Selection

The FRU selection process 901 first requests the problem number from the craftsperson. The craftsperson responds with the Composite Failure Event ID. Next, the FRU selection process displays the Suspect FRU List to the craftsperson. The craftsperson responds by displaying the Suspect FRU List 902 for the selected Composite Failure Event 903. The FRU selection process 901 always displays the Suspect FRU List in an order determined by strength or probability of success, while listing the relative strength or probability factors. The craftsperson selects the FRU to be replaced from this list.

At this point, the FRU selection process 901 determines whether the selected FRU can be safely removed from the customer equipment. It first obtains the specific domain which is to be used to fence the selected FRU, based on the specific domain contained within the selected Composite Failure Event. The FRU selection process 901 overlays the specific domain on the global fence map to evaluate whether imposing the FRU fence would restrict availability of the customer equipment below an acceptable minimum. The algorithm for this function varies according to the configuration of a given customer equipment. FRU fencing blocking occurs if, for instance, another domain within the customer equipment was fenced for an unrelated problem or process.

If, for this reason, the FRU fences cannot be placed, the craftsperson is advised that other fences are in place, and the reasons for these fence placements. The FRU selection process 901 then advises the craftsperson to resolve one of the existing problem situations before proceeding with the requested activity. If more than one fence activity is outstanding, one of these is selected by the FRU selection process 901 on the basis of nearness to completion, impact or severity and presents the craftsperson with a recommended next course of action. The craftsperson may elect to follow the suggested course of action or to bypass the restriction and proceed with the original request.

Guiding FRU Replacement

With the placement of FRU fences, the FRU selection process 901 then governs FRU replacement activity. If an indicator exists on the FRU, that indicator is lit and the craftsperson is told to replace the FRU, and the location of that FRU. The craftsperson proceeds to change the FRU and responds on completion of replacement.

Changed FRU Detection

The validation process 904 examines the physical identity of the selected FRU to determine whether that FRU was changed by the craftsperson. This is done by accessing the embedded FRU ID 905 at the selected location, which contains the FRU type and FRU unique serial number. If the FRU was not changed by the craftsperson, the validation process 904 then proceeds to check all of the FRUs of the type selected to see whether any of those were changed in error. If none of those were changed, all FRUs in the customer equipment are checked to see if any FRU was changed in error. If no FRU change is detected, the validation process 904 informs the craftsperson of that fact, unfences the selected FRU, and waits for further FRU selection requests.

A FRU misplacement normally initiates a number of failures of a quite severe nature. These are received and processed by the failure management system as described above. The offending FRU is identified and removed from service independently. However, for many reasons, the FRU misplacement may result in no additional failure detections whatsoever. In either case, the Guided FRU Replacement process is free to identify the FRU misplacement and place additional fences as necessary. It then guides the craftsperson through the replacements necessary to restore the original configuration, after which the craftsperson is encouraged to proceed with the original FRU change.

Automatic FRU Validation

Once a FRU change is successful, validation process 904 begins a sequence of checks and tests to ensure proper fit and operation of the FRU. Failure of any of these checks and tests causes the validation process 904 to reject the replacement FRU. Rejection of a FRU requires a craftsperson to re-establish the original configuration as described above.

Validation process 904 first ensures that the new FRU is at a hardware and software level that is compatible with customer equipment operation. Then a series of FRU diagnostics 906 are executed which ensure that the FRU is minimally capable of functional operation.

While these diagnostics are executing, the validation process 904 examines the arrival rate of the failures which are assigned to the Composite Failure Event. In many cases, the failure arrival rate is such that a statistically meaningful interval may be established which is of short enough duration that functional operation may be monitored by the craftsperson. If the problem is indicative of a long-period intermittent then an arbitrary interval is selected which is long enough to ensure the functional use of the FRU without error. When diagnostic testing completes, the FRU is unfenced and placed in closely-monitored functional operation for the determined duration with the craftsperson present. A trace is configured which records activity in which nodes on the FRU are accessed. If a failure occurs for which any nodes on the FRU are suspect then the FRU is rejected and the original configuration restored as described above.

Problem Interim and Final closure

If the FRU passes all of the described testing and monitoring then FRU selection process 901 gives the Composite Failure Event an interim closure state. While in this state the problem may be reopened if a failure occurs within the specific domain of the Composite Failure Event. This is done by setting the Recursion Flag 810. If a new failure is attributed to a Composite Failure Event while its Recursion Flag is set then the FRU which was replaced is removed from the Suspect FRU List and the problem is immediately returned to the isolation phase. This mechanism manages multi-FRU isolation procedures for long-period intermittents.

Similarly, when a FRU is accepted for one Composite Failure Event, all open Composite Failure Events are examined to see whether that FRU is listed as a suspect. Each open Composite Failure Event for which that FRU is listed as a suspect is placed in an interim closure state and its Recursion Flag is set.

After an additional period of functional operation, an interval lasting from weeks to months, the Composite Failure Event is placed in a final closure state. In this state the specific domain of the Composite Failure Event is no longer considered for domain matching when receiving new failure reports.

Non-failure FRU Change

It is common for FRU replacement to be triggered by a system upgrade or other change which doesn't involve a problem situation. Processing for this case is very similar to that described above. The FRU selection process 901 permits the craftsperson to identify any FRU location without first identifying a problem Composite Failure Event. Proper placement is ensured and validation process 904 verifies system fit and functional operation. After validation the FRU selection process examines all open CFEs to see if the replaced FRU falls within any Suspect FRU List 902. Events are placed in an interim closure state and their Recursion Flags are set.

FRU Exchange Management

When more than one Suspect FRU exists for a problem it is possible for the craftsperson to set up a test situation in order to confirm the precise failing FRU, using a FRU exchange. If a FRU exchange is requested through Guided FRU Replacement, the FRU selection process 901 identifies a domain which is identical to the generalized domain in which the problem tracked by the Composite Failure Event resides and which is completely distinct from the specific domain of the Composite Failure Event 1001. The FRU selection process identifies a FRU within that domain of the same type and with the same hardware and software compatibilities as the selected FRU. The FRU selected process then creates a "virtual" Composite Failure Event 907, 1002 which is identical to and linked to the base Composite Failure Event 1001 but whose Suspect FRU List 1003 reflects only the FRU which is being removed from the base Composite Failure Event's Suspect FRU List 1004. When the craftsperson signals that the FRU exchange is complete, both FRUs are validated as above; if either FRU is rejected for any reason the original configuration is re-established, the virtual Composite Failure Event is deleted, and the FRU which failed is recommended for replacement.

If a failure occurs subsequent to an exchange, the offending Suspect FRU List is identified by the specific domain in which the failure falls. Since the specific domain determines the Composite Failure Event to which the failure is assigned it is applied to the base or the virtual Composite Failure Events, but not both. In this manner the test is successfully executed and one or more FRUs is excluded from consideration. When the craftsperson services either the base or virtual Composite Failure Event, that Composite Failure Event is marked for interim closure as above. The other exchange Composite Failure Event is not modified. After the closure interval has elapsed with no further failures attributed to either base or virtual Composite Failure Event, both are closed.

Changed FRU Detection at IML

All system FRUs are checked during system bringup in order to detect changes which may have occurred during a system outage. If a FRU change is detected the new FRU is validated as described above. The FRU is accepted for functional operation if all validation steps pass, and any open Composite Failure Event for which the FRU is a Suspect FRU List member is given an interim closure and its Recursion Flag is set. If not, the FRU is barred from functional operation with FRU fences and a new Composite Failure Event is created whose Suspect FRU List contains only the new FRU.

An additional step is taken when more than one FRU is detected. If two identical FRUs which reside in separate domains are exchanged, and no virtual Composite Failure Event exists to track an exchange, one is created. If a base and virtual Composite Failure Event exist already for the pair, the history log is examined to determine whether the exchange pair were placed in their original configurations; if so, the virtual Composite Failure Event is deleted. If not, and an additional base Composite Failure Event Suspect FRU List member has been exchanged, a new virtual Composite Failure Event with modified Suspect FRU List is created to track the new exchange. It can easily be seen that more complex situations can be managed by implementing additional variations of this mechanism.

Placing a Spare or Reserved Resource in Operation

Assume that in net 1 (500) it is desired that only one node E is in operation at a time. In the global node map, then, the node E which is not in functional use is fenced in Offline mode, making two nodes D unavailable to customer operation. If, then, a failure or other occurrence causes a need to remove the other node E from service, it is possible to simultaneously fence that node E to remove it from customer operation and insert the redundant node E by removing its fences, enabling its paths D+E for customer operation.

The same results may be achieved by first suspending customer operation within Net 1 (500) by making nodes A1-A4 unavailable to operations external to the net, then switching nodes E, then re-enabling nodes A1-A4.

While a specific embodiment of this invention has been disclosed, it is expected that those skilled in the art can and will design alternate embodiments of this invention that fall within the scope of the appended claims.

We claim:

1. Apparatus for controllably managing the replacement of field replaceable units in a customer system, which customer system includes a plurality of operational elements, each interconnected to at least one other operational element via an interconnection path, said operational elements being mounted on a plurality of field replaceable units, comprising:
    means for storing data identifying all said operational elements and said interconnection paths;
    means for detecting the presence of a failure in said customer system;
    means for generating a failure report which contains data relevant to said detected failure, including an identification of the failure mode and all operational elements that were cooperatively operative during said detected failure;
    means for storing said failure report;
    means for mapping said stored failure reports to a stored composite failure event containing a list of field replaceable units containing said set of operational elements; and
    means, responsive to a craftsperson inquiry, for listing said stored composite failure event and said list of field replaceable units associated with said stored composite failure event.

2. The apparatus of claim 1 wherein said mapping means includes:
    means for maintaining a failure analysis history containing data identifying each of said operational elements and associated composite failure data representative of known operational element failures;
    means for comparing said stored failure report with said failure analysis history; and
    means for identifying a set of most likely failed operational elements based on said comparison.

3. The apparatus of claim 1 wherein said mapping means includes:
    means for ordering said list of field replaceable units in order of probability of failure.

4. The apparatus of claim 1 wherein said system further comprises:
    means, responsive to a craftsperson selecting one of said list of field replaceable units for replacement, for isolating said selected field replaceable unit by disabling all said interconnection paths connected to all said operational elements located on said selected field replaceable unit; and
    means, responsive to said craftsperson replacing said selected field replaceable unit with a replacement field replaceable unit, for testing said replacement field replaceable unit to verify the compatibility of said replacement field replaceable unit with said selected field replaceable unit.

5. The apparatus of claim 4 wherein said testing means includes:
    means for verifying the positional correspondence of said replacement field replaceable unit to said selected field replaceable unit.

6. The apparatus of claim 4 wherein said system further comprises:
    means, responsive to said craftsperson replacing said selected field replaceable unit with a replacement field replaceable unit, for suspending the generation of additional failure reports relating to said replacement field replaceable unit while said testing means verifies the compatibility of said replacement field replaceable unit with said selected field replaceable unit.

7. The apparatus of claim 4 wherein said system further comprises:
    means for recording the identity of said replacement field replaceable unit and its physical location in said customer system.

8. The apparatus of claim 1 wherein said system further comprises:
    means, responsive to a craftsperson selecting one of said list of field replaceable units for replacement, for computing customer system service impact data to identify the extent to which the operation of said customer system is impacted by disabling said selected field replaceable unit; and
    means, responsive to said computed service impact data exceeding a predetermined threshold, for alerting said craftsperson that disablement of said selected field replaceable unit has a significant negative impact on service in said customer system.

9. The apparatus of claim 8 wherein said listing means contains composite failure events indicative of a plurality of concurrently occurring failures, said alerting means includes:
    means for indicating to said craftsperson an alternative one of said concurrently occurring failures, listing said stored composite failure event and said list of field replaceable units associated with said stored composite failure event.

10. The apparatus of claim 1 wherein said system further comprises:
    means for auditing said plurality of field replaceable units using said stored data to verify the integrity of said customer system.

11. The apparatus of claim 10 wherein said system further comprises:
    means for activating said auditing means in response to said customer system exiting an inoperative state.

12. The apparatus of claim 10 wherein said system further comprises:
    means for activating said auditing means in response to one of said field replaceable units being replaced by a new field replaceable unit by said craftsperson.

13. The apparatus of claim 1 wherein said system further comprises:
    means, responsive to said craftsperson replacing one of said field replaceable units identified in said list with a new field replaceable unit, for noting all said failure reports associated with said replaced field replaceable unit as interim closed.

14. The apparatus of claim 13 wherein said system further comprises:
    means for noting a composite failure event as permanently closed when said new field replaceable unit does not fail for greater than a predetermined period of time.

15. Apparatus for controllably managing the replacement of field replaceable units in a customer system, which customer system includes a plurality of operational elements, each interconnected to at least one other operational element via an interconnection path, said operational elements being mounted on a plurality of field replaceable units, comprising:
- means for storing data identifying all said operational elements and said interconnection paths;
- means for detecting the presence of a failure in said customer system;
- means for generating a failure report which contains data relevant to said detected failure, including an identification of the failure mode and all operational elements that were cooperatively operative during said detected failure;
- means for storing said failure report;
- means for mapping said stored failure reports to a stored composite failure event containing a list of field replaceable units containing said set of operational elements; and
- means, responsive to a craftsperson inquiry, for listing said stored composite failure event and said list in field replaceable units associated with said stored composite failure event;
- means, responsive to said craftsperson selecting one of said field replaceable units identified in said list, wherein said identified field replaceable unit is one of a plurality of identical field replaceable units, for instructing said craftsperson to exchange said selected field replaceable unit with one of said plurality of identical field replaceable units;
- means, responsive to said craftsperson performing said exchange, for generating a virtual composite failure event duplicative of said composite failure event associated with said selected field replaceable unit; and
- means for mapping said virtual composite failure event to said exchanged selected field replaceable unit and said composite failure event with said exchanged one of said plurality of identical field replaceable units.

16. The apparatus of claim 15 wherein said system further comprises:
- means, responsive to said exchanged selected field replaceable unit failing, for identifying said exchanged selected field replaceable unit as inoperable; and
- means, responsive to said exchanged selected field replaceable unit being replaced, for noting said virtual composite failure event as closed.

17. The apparatus of claim 15 wherein said system further comprises:
- means, responsive to said exchanged selected field replaceable unit not failing, for identifying said exchanged selected field replaceable unit as not inoperable; and
- means for instructing said craftsperson to restore said exchanged selected field replaceable unit and said exchanged one of said plurality of identical field replaceable units to their respective original locations in said customer system.

18. A method for controllably managing the replacement of field replaceable units in a customer system, which customer system includes a plurality of operational elements, each interconnected to at least one other operational element via an interconnection path, said operational elements being mounted on a plurality of field replaceable units, comprising the steps of:
- storing data identifying all said operational elements and said interconnection paths;
- detecting the presence of a failure in said customer system;
- generating a failure report which contains data relevant to said detected failure, including an identification of the failure mode and all operational elements that were cooperatively operative during said detected failure;
- storing said failure report;
- mapping said stored failure reports to a composite failure event which contains a list of field replaceable units containing said set of operational elements; and
- listing, in response to a craftsperson inquiry, said stored composite failure event and said list of field replaceable units associated with said stored composite failure event.

19. The method of claim 18 wherein said step of mapping includes:
- maintaining a failure analysis history containing data identifying each of said operational elements and associated composite failure data representative of known operational element failures;
- comparing said stored failure report with said failure analysis history; and
- identifying a set of most likely failed operational elements based on said comparison.

20. The method of claim 18 wherein said step of mapping includes:
- ordering said list of field replaceable units in order of probability of failure.

21. The method of claim 18 further comprising the steps of:
- isolating, in response to a craftsperson selecting one of said list of field replaceable units for replacement, said selected field replaceable unit by disabling all said interconnection paths connected to all said operational elements located on said selected field replaceable unit; and
- testing, in response to said craftsperson replacing said selected field replaceable unit with a replacement field replaceable unit, said replacement field replaceable unit to verify the compatibility of said replacement field replaceable unit with said selected field replaceable unit.

22. The method of claim 21 wherein said step of testing includes:
- verifying the positional correspondence of said replacement field replaceable unit to said selected field replaceable unit.

23. The method of claim 21 further comprising the step of:
- suspending, in response to said craftsperson replacing said selected field replaceable unit with a replacement field replaceable unit, the generation of additional failure reports relating to said replacement field replaceable unit while said testing means verifies the compatibility of said replacement field replaceable unit with said selected field replaceable unit.

24. The method of claim 21 further comprising the step of:

recording the identity of said replacement field replaceable unit and its physical location in said customer system.

25. The method of claim 18 further comprising the steps of:

computing, in response to a craftsperson selecting one of said list of field replaceable units for replacement, customer system service impact data to identify the extent to which the operation of said customer system is impacted by disabling said selected field replaceable unit; and alerting, in response to said computed service impact data exceeding a predetermined threshold, said craftsperson that disablement of said selected field replaceable unit has a significant negative impact on service in said customer system.

26. The method of claim 25 wherein said listing contains failure reports indicative of a plurality of concurrently occurring failures, said step of alerting includes:

indicating to said craftsperson an alternative one of said concurrently occurring failures, listing said stored composite failure event and said list of field replaceable units associated with said stored composite failure event.

27. The method of claim 18 further comprising the step of:

auditing said plurality of field replaceable units using said stored data to verify the integrity of said customer system.

28. The method of claim 27 further comprising the step of:

activating said auditing step in response to said customer system exiting an inoperative state.

29. The method of claim 27 further comprising the step of:

activating said auditing step in response to one of said field replaceable units being replaced by a new replaceable unit by said craftsperson.

30. The method of claim 18 further comprising the step of:

noting, in response to said craftsperson replacing one of said field replaceable units identified in said list with a new field replaceable unit, all said composite failure events associated with said replaced field replaceable unit as interim closed.

31. The method of claim 30 further comprising the step of:

noting a composite failure event as permanently closed when said new field replaceable unit does not fail for greater than a predetermined period of time.

32. A method for controllably managing the replacement of field replaceable units in a customer system, which customer system includes a plurality of operational elements, each interconnected to at least one other operational element via an interconnection path, said operational elements being mounted on a plurality of field replaceable units, comprising the steps of:

storing data identifying all said operational elements and said interconnection paths:

detecting the presence of a failure in said customer system:

generating a failure report which contains data relevant to said detected failure, including an identification of the failure mode and all operational elements that were cooperatively operative during said detected failure:

storing said failure report:

mapping said stored failure reports to a composite failure event which contains a list of field replaceable units containing said set of operational elements; and listing, in response to a craftsperson inquiry, said stored composite failure event and said list of field replaceable units associated with said stored composite failure event instructing, in response to said craftsperson selecting one of said field replaceable units identified in said list, wherein said identified field replaceable unit is one of a plurality of identical field replaceable units, said craftsperson to exchange said selected field replaceable unit with one of said plurality of identical field replaceable units;

generating, in response to said craftsperson performing said exchange, a virtual composite failure event duplicative of said composite failure event associated with said selected field replaceable unit; and mapping said virtual composite failure event to said exchanged selected field replaceable unit and said composite failure event with said exchanged one of said plurality of identical field replaceable units.

33. The method of claim 32 further comprising the steps of:

identifying, in response to said exchanged selected field replaceable unit failing, said exchanged selected field replaceable unit as inoperable; and noting, in response to said exchanged selected field replaceable unit being replaced, said virtual composite failure event as closed.

34. The method of claim 32 further comprising the steps of:

identifying, in response to said exchanged selected field replaceable unit not failing, said exchanged selected field replaceable unit as not inoperable; and instructing said craftsperson to restore said exchanged selected field replaceable unit and said exchanged one of said plurality of identical field replaceable units to their respective original locations in said customer system.

* * * * *